United States Patent [19]
Bromberg

[11] Patent Number: 5,045,774
[45] Date of Patent: Sep. 3, 1991

[54] FULL SCALE AC OR DC POWER ATTENUATOR

[75] Inventor: Michael A. Bromberg, Brookline, N.H.

[73] Assignee: R. Morley, Inc., Amherst, N.H.

[21] Appl. No.: 458,172

[22] Filed: Dec. 28, 1989

[51] Int. Cl.$^5$ .............................................. G05B 24/02
[52] U.S. Cl. .................... 323/322; 323/224; 323/241; 323/246
[58] Field of Search ............... 323/224, 239, 241, 246, 323/322, 324, 349, 350

[56] References Cited

U.S. PATENT DOCUMENTS

| | | | |
|---|---|---|---|
| 3,564,394 | 1/1969 | Opal et al. | 323/224 |
| 3,622,849 | 11/1971 | Kelly | 323/246 |
| 3,879,652 | 4/1975 | Billings | 323/322 |
| 3,958,131 | 5/1976 | Mozdzer | 323/224 |
| 4,168,477 | 9/1979 | Burchall | 323/224 |
| 4,287,468 | 9/1981 | Sherman | 323/322 |
| 4,323,845 | 4/1982 | Leach | 323/224 |
| 4,358,729 | 11/1982 | Hart | 323/241 |
| 4,450,384 | 5/1984 | Krokauger | 315/127 |
| 4,500,802 | 2/1985 | Janutka | 363/60 |
| 4,633,161 | 12/1986 | Callahan et al. | 323/242 |
| 4,713,601 | 12/1987 | Zahm et al. | 323/324 |

OTHER PUBLICATIONS

"Use Power FETs to Design AC-Line Power Choppers", Tom Visel; Sep. 15, 1958 EDN.

Primary Examiner—R. Skudy
Assistant Examiner—Jeffrey Sterrett
Attorney, Agent, or Firm—Weingarten, Schurgin, Gagnebin & Hayes

[57] ABSTRACT

A remotely controllable, full scale, AC or DC power attenuator, for attenuating power to a load as a function of an input control signal which represents a selected percentage of power to be applied to the load. Bidirectional series switch means are responsive to the input control signal for connecting and disconnecting power to the load.

39 Claims, 7 Drawing Sheets

FULL SCALE AC OR DC POWER ATTENUATOR

FIELD OF THE INVENTION

This invention relates to power attenuators and more particularly, to a remotely controllable, full scale power attenuator capable of attenuating AC or DC power.

BACKGROUND OF THE INVENTION

Power attenuators are utilized in a wide variety of applications one example of which is the dimming of high wattage loads such as lamps used in theatrical, film, television and architectural applications. Prior art power attenuators include resistive attenuators, autotransformers and silicon control rectifier (SCR) dimmers.

Resistive attenuators, although capable of attenuating either AC or DC power while maintaining waveform fidelity, waste a tremendous amount of energy in the form of heat which must be dissipated. Autotransformers alternatively, are capable of attenuating AC power only and are generally quite heavy, making them unsuitable for many applications.

SCR dimmers operate by chopping the input waveform at selected intervals. In this manner, power may be attenuated by varying the interval or duty cycle during which the SCR dimmer is active. Although SCR dimmers do not suffer from the same weight and waste of energy shortcomings as do the resistive and Variac dimmers, the SCR dimmer is capable of attenuating AC power only and must operate in synchronism with the phase of the AC power input.

Many improvements have been made in the SCR dimmer since its introduction, although the fundamental components of the dimmer's power switching stage remain unchanged. For example, the power stage of SCR dimmers utilizes a pair of SCRs and a magnetic inductor or choke.

The magnetic inductor is used to slow the rate of current change produced by the sharp voltage steps of the SCRs. This sharp voltage and subsequent current step in the attached load also produces a large amount of electro-magnetic interference (EMI). EMI is manifested as audible noise emanating from the SCR dimmer, audible lamp filament buzz which reduces filament life, as well as many other undesirable effects on electronic equipment attached to or near the AC power source.

In order to minimize the effects of EMI, larger magnetic inductors have been provided. This adds tremendously to the cost and weight of the dimmer. In addition, EMI interference has also dictated that in many instances where audible noise must be kept to a minimum, SCR dimmers must be located in a separate room, remote from the loads they are to control.

Typically, racks with as many as 192 dimmers are located remotely from the loads. This requires many large high power copper cables connecting each load to the dimmer, as well as a specially cooled room to house the racks of dimmers. An additional drawback is that the resultant configuration of one dimmer per circuit allows for only as many control points as there are circuits.

SUMMARY OF THE INVENTION

The present invention is a remotely controllable, full scale, AC or DC power attenuator, capable of attenuating AC or DC power to a load as a function of a power attenuation selected from the range of between zero to one-hundred percent (0 to 100%). The power attenuator of the present invention generally eliminates audible noise, is not dependent on the phase or polarity of the input power and allows for individual load control of power attenuation by allowing the attenuator to be located at and control each individual load.

The remotely controllable, full scale AC or DC power attenuator of the present invention includes means for receiving an input control signal representing a selected percentage of power to be applied to the load and for providing first and second control output signals. Bidirectional series switch means, responsive to the first control output signal, connects power to the load and responsive to the second control output signal disconnects the power from the load. Bidirectional shunt switches, responsive to the second control output signal, connect the load to the power supply return.

In a preferred embodiment, microprocessor means are provided which receives the input control signal. The input control signal includes a selected power attenuation from a remote power attenuation selection device. The input control signal is coupled to the microprocessor by an input port which is electrically isolated from the microprocessor. The microprocessor provides a digital power attenuation signal to a pulse width modulator.

The pulse width modulator outputs a digital signal having an active signal portion and an inactive portion. The ratio of active signal portion to the entire signal period corresponds to the percentage of power to be applied to the load. Means, responsive to the pulse width modulated digital signal, provide a plurality of activation pulses during the active signal portion of the pulse width modulated digital signal, and a plurality of deactivation pulses during the inactive portion of the pulse width modulated digital signal. Power switching means, responsive to the activation and deactivation pulses, are provided for connecting power to the load during receipt of the activation pulses, and for disconnecting power from the load during receipt of the deactivation pulses.

The preferred embodiment also includes isolation means coupled between the means for providing a plurality of activation and deactivation pulses and the power switching means. The isolation means includes an input section and an output section for receiving activation and deactivation pulses at a first voltage level, and for providing the activation and deactivation pulses at a second voltage level independent of the first voltage potential. The input section of the isolation means is comprised of first and second segments which receive the activation and deactivation pulses respectively, at a first voltage potential in response to the means for providing a plurality of activation and deactivation pulses.

The output section of the isolation means also includes first and second segments for providing the activation and deactivation pulses respectively to the power switching means at a second translated voltage potential.

The power switching means includes a bi-directional power switch in series with the load and the power source. The bidirectional series power switch is energized in response to the plurality of activation pulses for connecting power to the load, and de-energized in response to the deactivation pulses, for disconnecting power from the load. The power switching means also includes a bidirectional shunt switch, responsive to the deactivation pulses for connecting the load to the power supply return during the inactive portion of the input control signal.

BRIEF DESCRIPTION OF THE DRAWINGS

These and other features of the present invention will be better understood by reading the following detailed description taken together with the drawings, wherein.

DETAILED DESCRIPTION OF THE DRAWINGS

Figure 1:
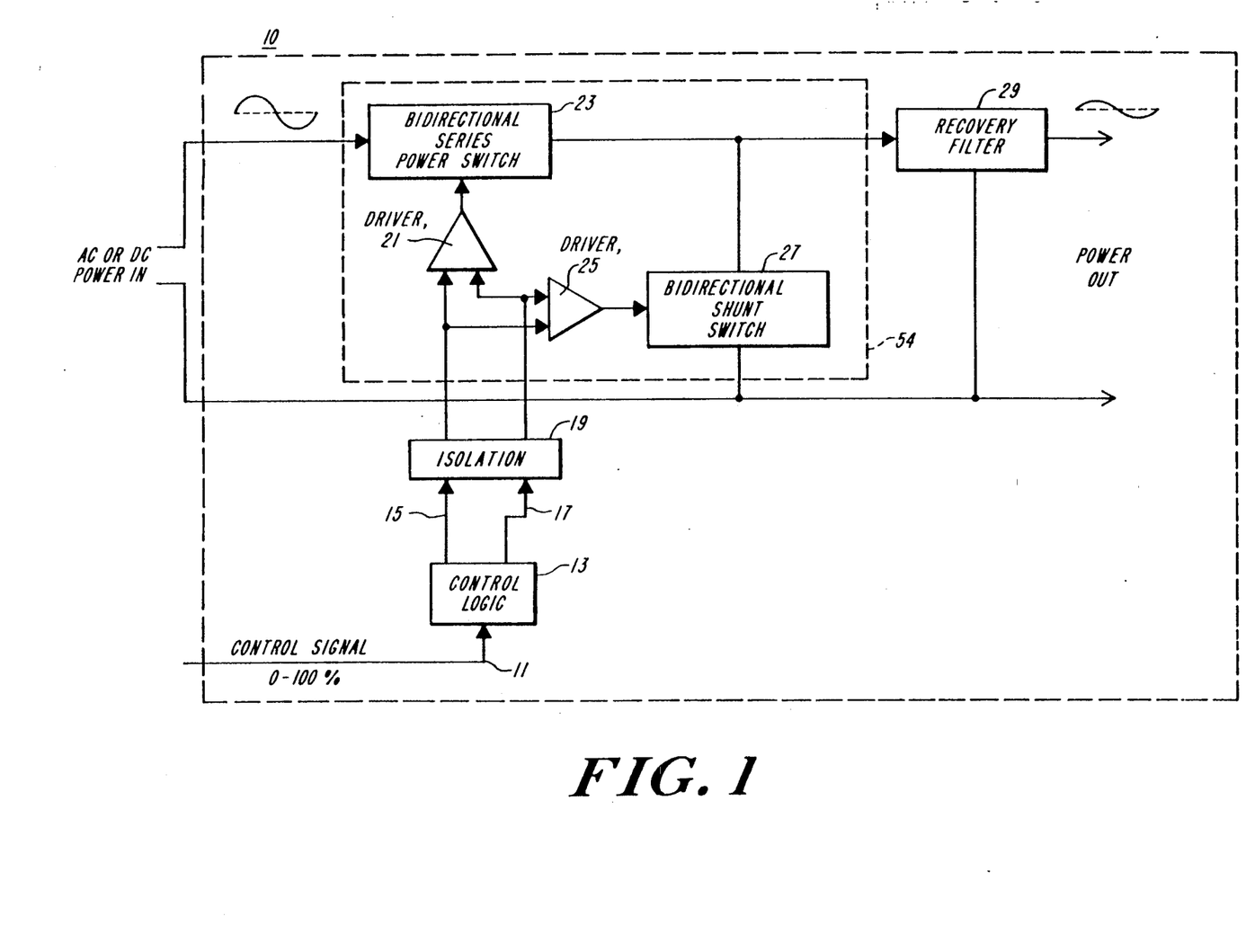
FIG. 1 is a block diagram of the remotely controllable, full scale AC or DC power attenuator according to the present invention.

The remotely controllable, full scale AC or DC power attenuator 10, FIG. 1, according to the present invention includes control logic 13 which receives input control signal 11. In the preferred embodiment in which control of power attenuator 10 is from a remote source, signal 11 includes a code or other representation of the percentage of power to be applied to the load. Control logic 13, in response to input control signal 11, generates first and second power attenuation signals over signal paths 15 and 17 to isolation means 19. The first power attenuation signal includes a plurality of activation pulses which are coupled to driver circuitry 21 and serve to energize bidirectional series power switch 23, connecting power to the load. The second power attenuation includes a plurality of deactivation pulses which are also coupled to driver circuitry 21 and serve to de-energize bidirectional series power switch 23. The first and second power attenuation signals including the plurality of activation and deactivation pulses are also coupled to driver circuitry 25 and serve to energize and de-energize bidirectional shunt switch 27 in parallel with the load, for connecting and disconnecting the load to the power supply return. In the preferred embodiment, control logic 13 generates the first and second power attenuation signals having a plurality of activation and deactivation pulses respectively responsive to input control signal 11. Alternatively, control signal 11 may include a first and second power attenuation signals in which case control logic 13 serves to divide or distribute the first and second power attenuation signals over their respective signal paths.

Control signal 11 may be provided as either an analog or a digital signal with control logic 13 containing appropriate circuitry to receive the control signal. Recovery filter 29 integrates the output of the series power switch and the shunt switch into a smooth power output waveform which is a scaled replica of the input power waveform.

In a second embodiment, power attenuator 10 may be provided as a stand alone unit including means for selecting the percentage of power to be applied to the load. The means for selecting the percentage of power to be applied to the load generates control signal 11 which represents the percentage of power to be applied to the load as a function of the means for selecting. In a third embodiment, the power attenuator according to this invention may be configured as an internally controlled, pre-programmed power attenuator wherein control signal 11 is generated by logic internal to the power attenuator and executed a pre-selected power attenuation sequence as a function of the pre-programmed control signal.

Figure 2:
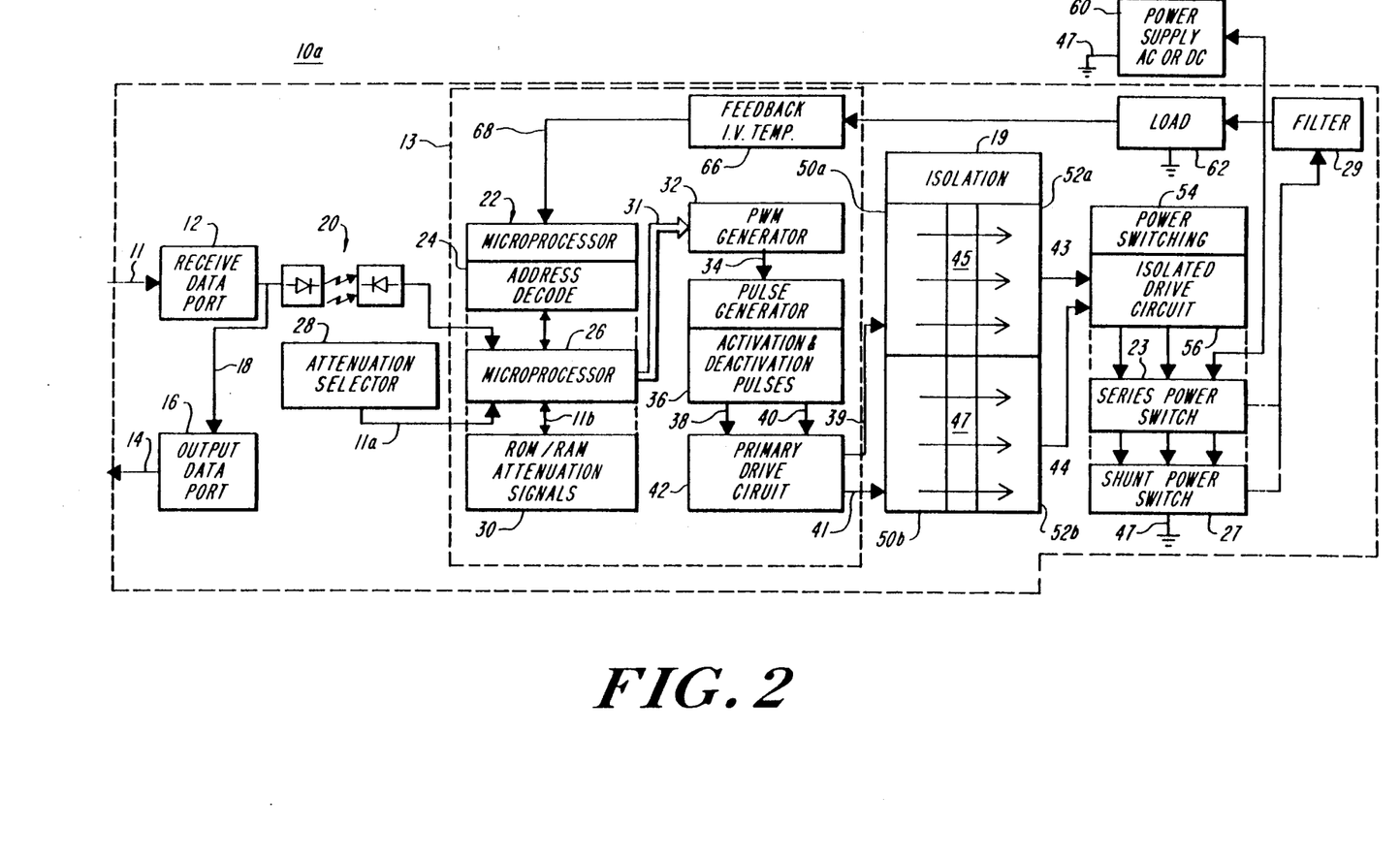
FIG. 2 is a more detailed block diagram of the power attenuator shown in FIG. 1.

In the preferred embodiment, power attenuator 10a, FIG. 2, according to the present invention includes port 12 which is adapted to receive input control signal 11. Output data port 16 is connected to isolation circuitry by means of signal path 18 and provides status output 14 to another device. Isolation circuitry 20 electrically isolates receive port 12 and output data port 16 from the remainder of the circuitry located within power attenuator 10a. Isolation circuitry 20 may include a photocoupler or other optical isolation device.

Input control signal 11 is coupled from isolation circuitry 20 to processor segment 26 of microprocessor means 22. When the power attenuator 10a is configured in an environment including multiple attenuators, input control signal 11 includes an address code. Address decoder segment 24 compares the address code received by way of input control signal 11 to a predetermined attenuator address code stored within address decoder segment 24. Upon receipt of a matching device address code, address decode segment 24 activates processor segment 26 to provide the selected power attenuation to load 62. When the attenuator is configured in a stand alone embodiment, power attenuator 10a includes attenuation selector 28 to provide for non-remote manual selection of power attenuation signal 11a. Attenuator selector 28 may include a manually adjustable slide, rotary dial, or other similar device.

Microprocessor means 22 also includes semiconductor memory storage unit 30 comprising of Read Only Memory (ROM) and Random Access Memory (RAM). ROM generally contains the program code necessary to the operation of processor segment 26, while RAM provides memory locations within which processor segment 26 may store operating variables and parameters. In the additional embodiment in which the power attenuator of the present is configured as a self-controlled, pre-programmed power attenuator, semiconductor memory storage unit 30 is utilized to store preselected power attenuations which are transmitted to processor segment 26 over signal path 11b.

Processor segment 26 of microprocessor means 22 is adapted to receive input control signals 11, 11a and 11b in the form of analog or digital signals. Upon receipt of any one of input control signals 11, 11a and 11b, processor segment 26 converts the received input control signal into a corresponding digital power attenuation signal 31. Power attenuation signal 31 is transmitted to pulse width modulation generator 32.

Pulse width modulation generator 32 provides pulse width modulated signal 34 to pulse generator 36. Pulse width modulated signal 34 has an active signal portion and an inactive signal portion. The ratio of the active signal portion to the sum of the periods of the active and inactive signal portions of pulse width modulated signal 34 corresponds to the percentage of power to be applied to the load as specified by input control signal 11.

Pulse generator 36 provides a plurality of high speed activation and deactivation pulses in response to pulse width modulated signal 34. The high speed activation pulses are provided over signal path 38 to primary drive circuit 42, during the active signal portion of pulse width modulated signal 34. Similarly, high speed deactivation pulses are provided to primary drive circuit 42 by means of signal path 40 during the inactive signal portion of pulse width modulated signal 34. Primary drive circuit 42 provides increased electrical current drive for the activation and deactivation pulses.

The activation and deactivation pulses are coupled from primary drive circuit 42 to isolation means 19 over signal paths 39 and 41. Isolation means 19 is comprised of first transformer 45 and second transformer 47. The present invention operates as a truly full scale, 0 to 100% power attenuator. Accordingly, bidirectional series power switch 23 and bidirectional shunt power switch 27 may be energized and de-energized at any given moment in time, without regard to the voltage potential on the switches at the given moment. Therefore, the switches must be provided with a drive voltage of sufficient potential with respect to the voltage potential being attenuated to the load, to cause the switches to be energized or de-energized. Accordingly, transformers 45 and 47 serve as voltage translators, allowing the transformers to receive activation and deactivation pulses at input segments 50a and 50b at a first predetermined voltage potential and independent of each other's voltage potential. The activation and deactivation pulses are then coupled to output sections 52a and 52b without regard to the voltage potential on series power switch 23, shunt power switch 27 or isolation drive circuit 56. Since pulse generator 26 provides activation and deactivation pulses as a plurality of high speed pulses, transformer saturation is eliminated and the activation and deactivation pulses are coupled to power switching means 54 over signal paths 43 and 44 respectively. Isolation means 19 may also be implemented utilizing optically coupled devices.

Isolated drive circuit 56 energizes bidirectional series power switch 23 during receipt of the activation pulses, for connecting AC or DC power supply 60 to load 62. Similarly, deactivation pulses from isolated drive circuit 56 deactivates power switch 58 for disconnecting AC or DC power supply 60 from load 62 and for activating bidirectional shunt power switch 27.

Bidirectional shunt power switch 27 is provided in parallel with load 62, and is energized in response to the deactivation pulses during de-energizing of series power switch 23, for connecting the load 62 to power supply return 47 and providing a path for current from the load to recirculate. Sensing means 66 is provided for monitoring and sensing a change in condition in load 62. Such change in condition may include a change in voltage, current, or temperature. The sensing means 66 provides feedback over signal path 68 to microprocessor means 22 for controlling the amount of power applied to load 62 as a function of the monitored conditions.

Figure 3:
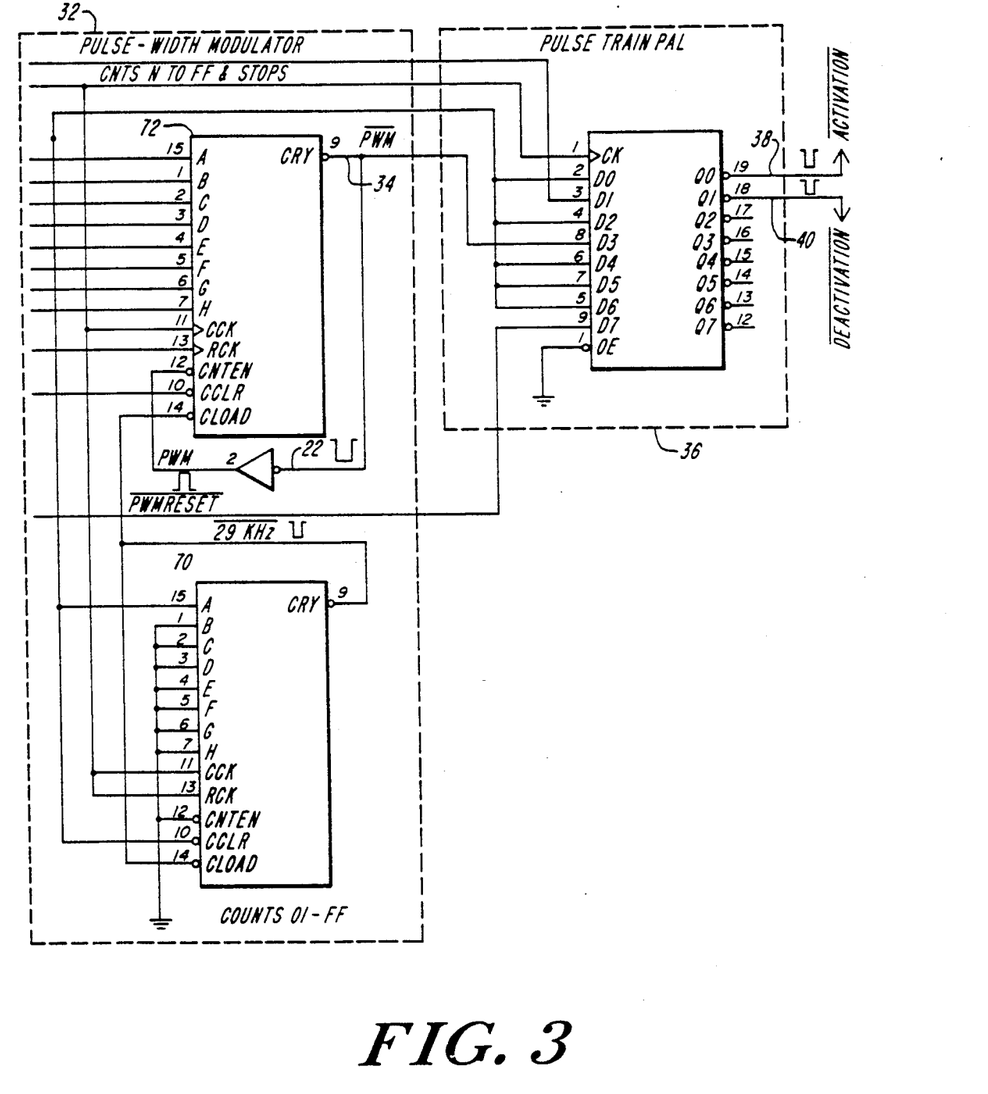
FIGS. 3 and 4 are schematic diagrams of a preferred embodiment of the remotely controllable, full scale AC or DC power attenuator according to the present invention.

Pulse width modulation generator 32, FIG. 3, is shown in greater detail and is implemented in the preferred embodiment with first and second counters 70 and 72 respectively. First counter 70 provides for a fixed, unmodulated signal period of approximately 30Khz. The output from first counter 70 is provided to second counter 72 for enabling the loading of a variable value into the counter. The variable value corresponds to the percentage of power to be applied to the load as requested by the input control signal or internal selection device. The value loaded in second counter 72 provides the active signal portion of pulse width modulated signal 34 which appears on pin 9 of the counter 72 and is coupled by means of signal path 34 to pulse generator 36. In response to the pulse width modulated signal, pulse generator 36 generates a plurality of high speed activation pulses on signal path 38 during the active portion of the pulse width modulated signal, and provides a plurality of deactivation pulses over the signal path 40 during the inactive portion of the pulse width modulated signal. The frequency of the activation and deactivation pulses are approximately sixteen times that of the pulse width modulated signal. Although shown implemented utilizing programmable logic, pulse generator 36 may also be implemented utilizing oscillators and flip-flops to achieve multiplication of the pulse width modulated signal, as well as by any other means known to those skilled in the art.

Figure 4:
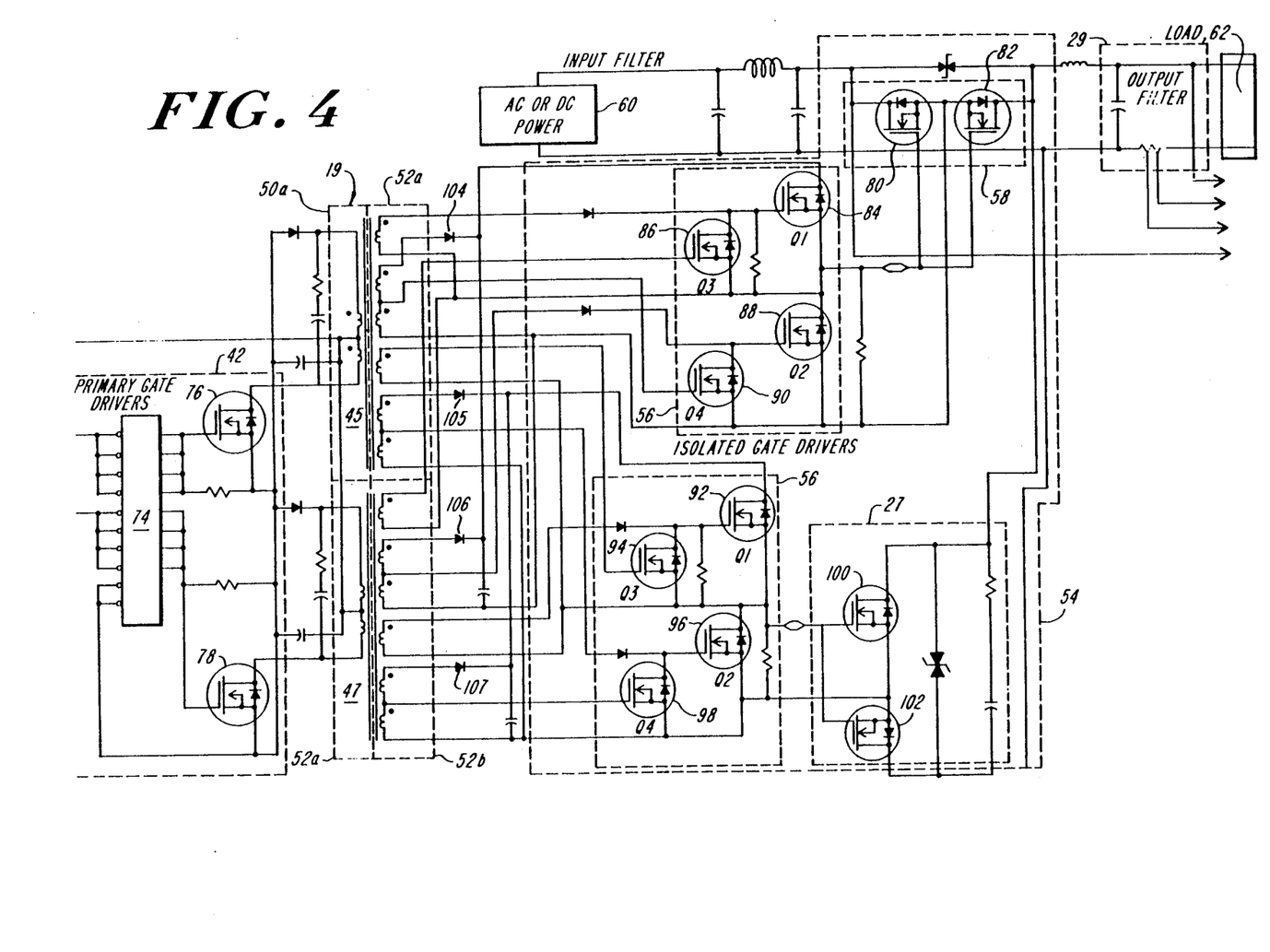

The activation and deactivation pulses are coupled to primary drive circuit 42 shown in greater detail in FIG. 4. Primary drive circuit 42 includes driver/receiver 74 which receives the activation and deactivation pulses from the pulse generator and couples the pulses to first and second primary driver devices 76 and 78 respectively. First and second primary driver devices 76 and 78 include field effect transistors such as an MTD3055EL.

The activation pulses enable first primary driver device 76, for providing the activation pulses to input segment 50a of transformer 45. Input segment 50b of transformer 47 receives deactivation pulses from second primary driver 78. The activation and deactivation pulses are received at a first voltage potential determined by the voltage which is provided to the drains of the first and second primary driver FETs 76 and 78.

Input segment 50a of transformer 45 couples activation pulses to output segment 52a of the transformer. Similarly, deactivation pulses are coupled from input segment 50b to output segment 52b of the transformer 47. Each of the transformers maintain electrical isolation between their respective input and output sections allowing isolation means 19 to receive the activation and deactivation pulses at a first voltage potential and independent of each input voltage potential, while providing the activation and deactivation pulses to power switching means 54 at a second voltage potential, independent of the input of voltage potential and independent of each output voltage potential, and with enough potential to activate the isolated power switch drivers 56.

Power switching means 54 includes bidirectional series power switch circuitry 23 and bidirectional shunt power switch circuitry 27. The bidirectional series power switch is in series with power supply 60 and load 62. The bi-directional series power switch is comprised of first FET 80 and second FET 82. The first and second FET's are connected in anti-series configuration, source-to-source and gate-to-gate. This manner of interconnection allows for bi-directional current flow needed for attenuating AC power or DC power of either polarity. During the positive going portion of the AC cycle, current flows through the channel of FET 80 and the diode of FET 82, while during the negative going portion of the AC waveform, current flows through the channel of FET 82 and the diode of FET 80.

Bidirectional shunt power switch 27 includes first and second FETs 100, 102 also connected source-to-source and gate-to-gate to allow for bi-directional current flow. Diodes 104 and 106 provide DC power to isolated gate driver FETs 84-98, while diodes 105 and 107 provide DC power to isolated gate drive FETs 92-98. Power switching means 54 also includes isolated drive circuits 56 comprising first through fourth series power switch drive FETs 84-90, and first through fourth shunt switch drive FETs 92-98.

Figure 5:
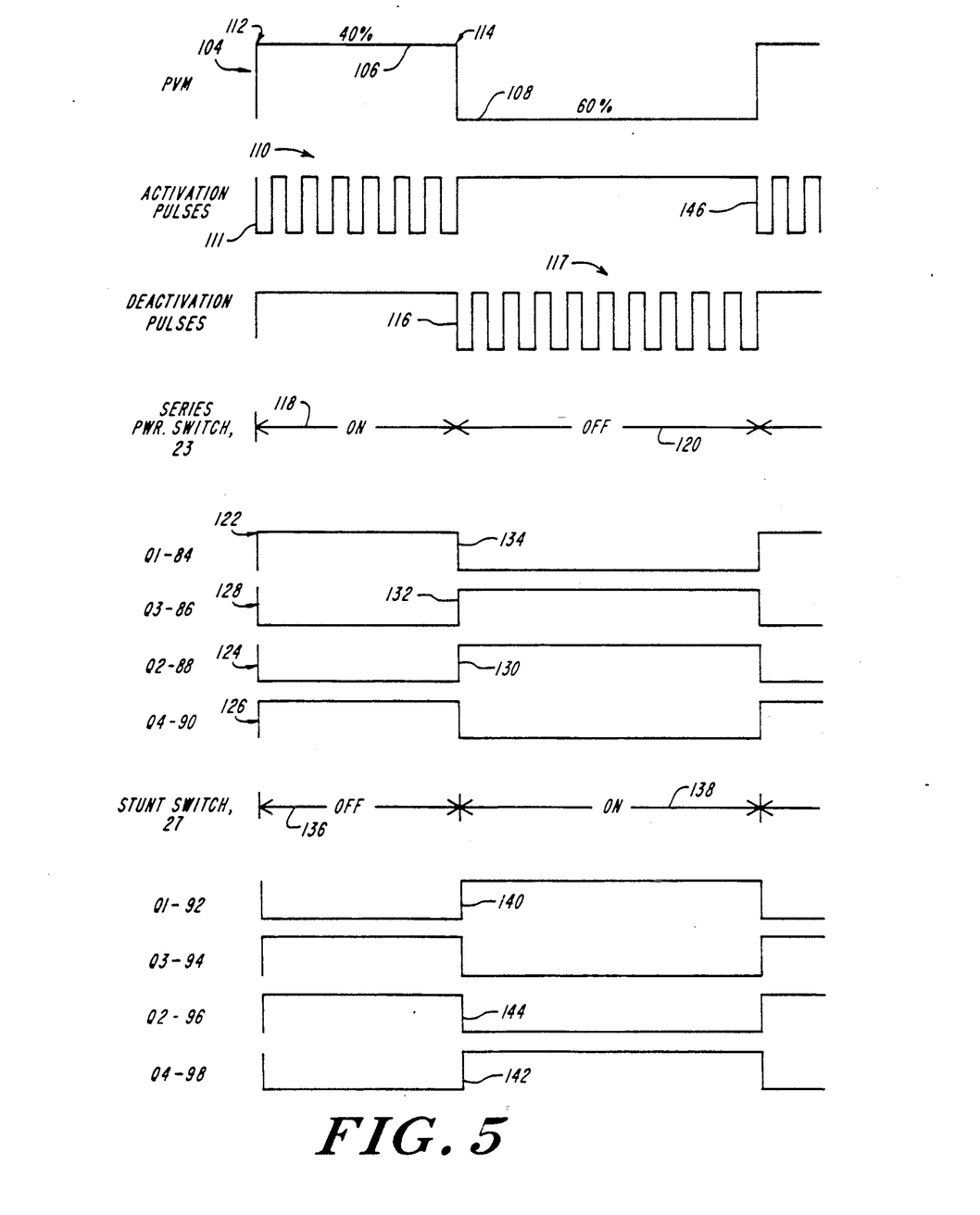
FIG. 5 is a timing diagram showing the relationship of the pulse width modulation and power stage control signals of the attenuator of the present invention.

Operation of the power switching means shown in FIG. 4 and its relationship with the pulse width modulated signal and the activation and deactivation pulses will be better understood in combination with FIG. 5, wherein is shown pulse width modulated signal 104 having active portion 106 and inactive portion 108. Active portion 106 corresponds to the percentage of power to be applied to the load as selected by the input control signal. During active portion 106 of pulse width modulated signal 104, pulse generator 36 provides activation pulses 110. The pulse generator generates first activation pulse 111 at time 112 immediately upon the beginning of active portion 106 of pulse width modulated signal 104. The pulse generator continues to provide activation pulses during the active signal portion of the pulse width modulated signal.

Immediately upon the beginning of inactive portion 108 of pulse width modulated signal 104 as indicated by arrow 114, the pulse generator generates the first deactivation pulse 116 and continues to generate deactivation pulses 117 during the inactive portion 108 of pulse width modulated signal 104.

The activation and deactivation pulses energize bidirectional series power switch 23 during active portion 106 of pulse width modulated signal 104 as represented by arrow 118, thereby connecting power supply 60 to load 62. Bidirectional series power switch 23 is de-energized during the time represented by arrow 120 and corresponding to inactive portion 108 of pulse width modulated signal 104. To ensure that the bidirectional series power switch and the bidirectional shunt power switch are not energized simultaneously at transition points 112 and 114, isolated gate driver FETs 84-98 are provided to assure that the series power switch and the shunt power switch are rapidly energized and de-energized with generally no delay and no overlap.

First isolated gate driver FET 84 is energized in response to activation pulses 110 from output section 52a of transformer 45 as illustrated by waveform 122. Although the activation pulse 111 becomes inactive after a short period of time, the charge stored on the gate of first FET 84 continues to energize the FET. The subsequent activation pulses 110 serve to refresh the charge stored on the gate of FET 84, thereby ensuring that the FET remains on while the activation pulses are being generated, and energizing bidirectional series power switch FETs 80 and 82.

Second FET 88 is coupled to output section 52b of transformer 47, and receives deactivation pulses only. During active portion 106 of pulse width modulated signal 104, the gate of second power FET 88 does not receive any enabling pulses, and therefore FET 88 is disabled as shown at 124.

To ensure that the second FET 88 remains disabled during active signal portion 106, fourth FET 90 is provided and has its gate cross-coupled to transformer output segment 52a which is providing activation pulses, thereby enabling fourth FET 90 as shown at 126. Enabling FET 90 shorts the gate and source of second FET 88 thereby ensuring that FET 88 remains disabled. Third FET 86 is coupled to output section 52b of deactivation pulse transformer 47 and is connected to the gate and source of first power FET 84. During the active portion 106 of pulse width modulated signal 104, the gate of third FET 86 receives no pulses and is therefore disabled as shown at 128.

At time 114, first deactivation pulse 116 immediately occurs. This pulse enables second FET 88 as shown at 130, which shorts the gate and source of power switch FETs 80 and 82, thereby turning the bidirectional series power switch off as illustrated by arrow 120. Deactivation pulse 116 also enables third FET 86, as shown at 132, thereby shorting the gate to source of first FET 84 and disabling the first FET as represented at 134.

Accordingly, by providing separate activation and deactivation segments in the isolation means as illustrated in the preferred embodiment by two transformers, and by further cross-coupling pairs of driver FETs to the activation and deactivation segments, the power attenuator of this invention assures that the power switching occurs generally instantaneously, and without regard to whether there is an overlap between the activation and deactivation pulse trains. In addition, by providing a plurality of high-speed activation and deactivation pulses to the FET components, full scale 0 to 100% power attenuation may be provided utilizing inexpensive and reliable transformers and eliminating the problem of transformer saturation which would be present if pulse width modulated signal 104 were used to drive the transformers.

Bidirectional shunt power switch 27, comprised of anti-series connected FETs 100 and 102, operates in the same manner as does bidirectional series power switch 23 although in an opposite state. As represented by arrow 136, shunt switch 27 is off during time period 118 when series power switch 23 is on, while shunt switch 27 is on during time period 138 while series power switch 23 is off. Shunt switch driver FETs 92-98 are also cross coupled to the activation and deactivation transformer output sections to insure that shunt power switch 27 is energized only when deactivation pulses are present. As illustrated in the timing diagram, first shunt FET 92 is enabled at 140 by deactivation pulse 116 thereby enabling the shunt switch. The deactivation pulses also enable fourth shunt FET 98 to disable second shunt FET 96 as shown at 142 and 144 respectively.

Upon receipt of subsequent activation pulse 146, the series power switch and shunt power switch drivers reverse state, thereby enabling the series power switch and immediately disabling the shunt power switch.

Figure 6:
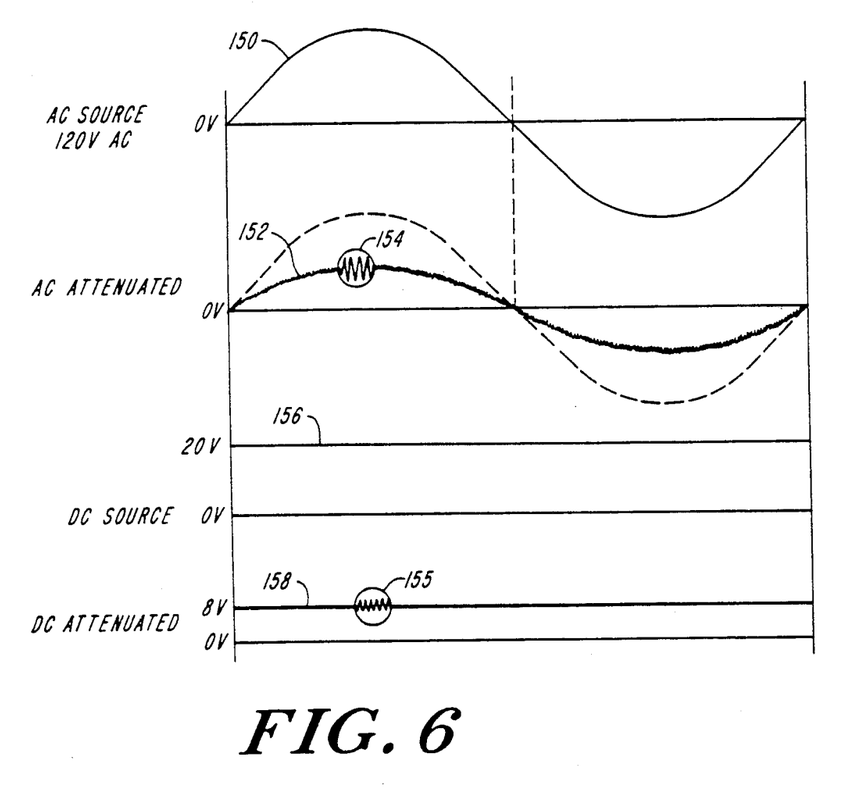
FIG. 6 is a signal diagram showing the relationship of the input waveforms and the attenuated output waveforms for both AC and DC power signals.

The power attenuator of the present invention accordingly provides full scale power attenuation of either AC or DC input power, without regard to phase or polarity of the input power. For example, for AC input signal 150, FIG. 6, a 40% power attenuated signal 152 is provided which is a scaled replica of the input power with only a small amount of high frequency switching noise 154. Similarly, attenuation of DC signal 156 results in attenuated DC level 158 with only a small amount of high frequency switching noise 155.

Figure 7:
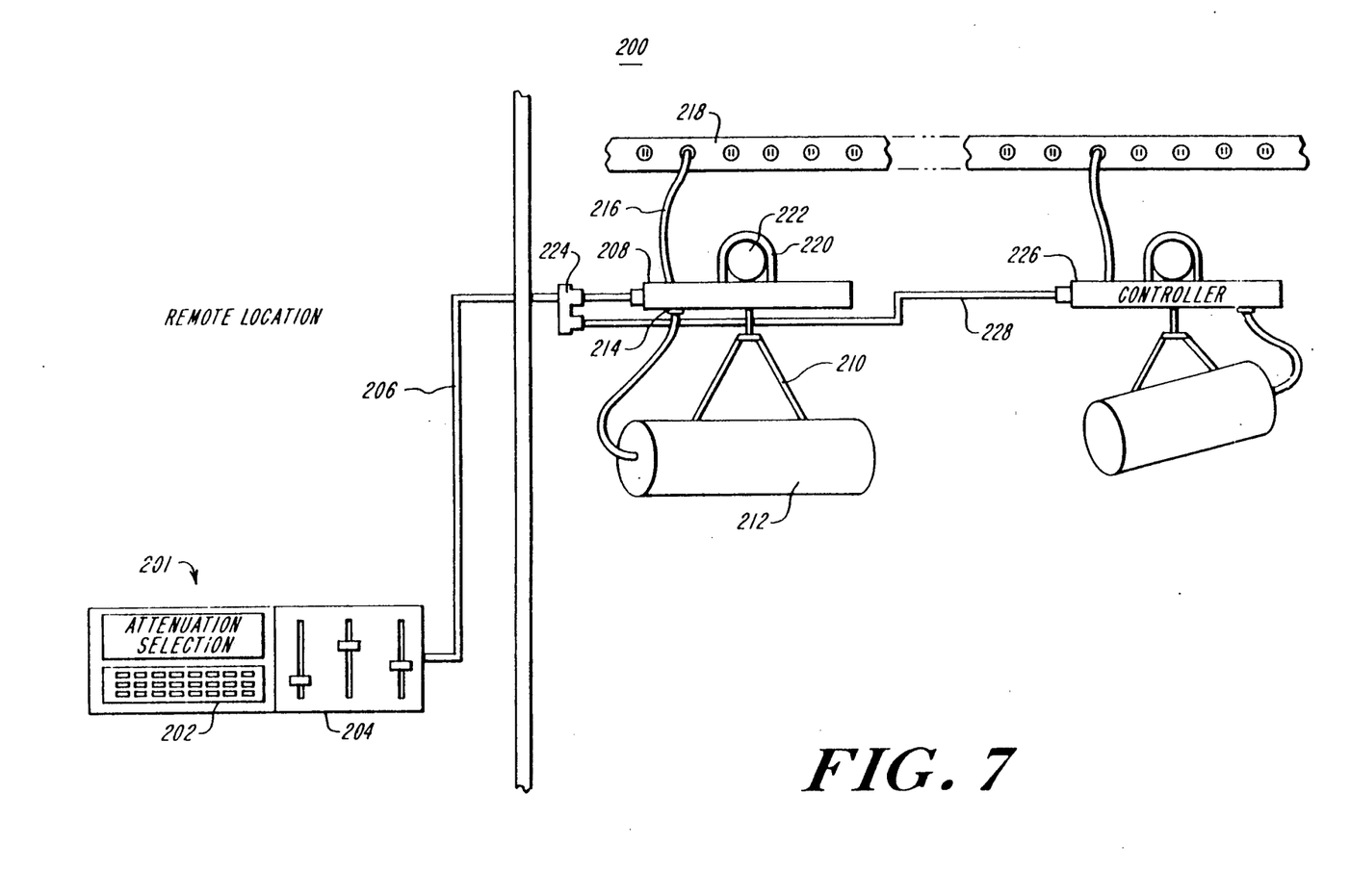
FIG. 7 is a pictorial view showing the attenuator of the present invention utilized as a light dimmer in a typical application environment.

The full scale power attenuator according to the present invention may be utilized as part of a remotely controllable, full scale light dimmer system 200, FIG. 7, employing a remotely located power attenuation selection device 201 such as a computer 202 or a light intensity selection instrument 204. The attenuation selection device provides an input control signal by means of cable 206 to first power attenuator 208 and also receives status information from the power attenuator over the same cable. First power attenuator 208 may include mounting bracket 210 which serves to mount light 212 whose intensity is to be controlled. Receptacle 214 allows the lamp or other device whose power is to be attenuated to be connected to the power attenuator. Attenuator power cable 216 connects power attenuator 208 to AC or DC power supply terminal receptacle 218. Power attenuator 208 may also include clamp 220 for mounting to pole 222 for use in stage lighting. Signal splitter or tee 224 on cable 206 allows the input control signal along with a predetermined address to be passed on to second attenuator 226 by means of cable 228. In this manner, a large number of the power attenuators according to the present invention may be bussed together to allow each load to be remotely and independently, fully attenuated.

Modifications and substitutions to the present invention by one of ordinary skill in the art are considered to be within the scope of the present invention and the claims which follow.

What is claimed is:

1. A full scale AC or DC power attenuator, for providing power attenuation to a load as a function of an input signal comprising:
    pulse width modulation means, responsive to said input signal, for providing a pulse width modulated signal having an active signal portion and an inactive signal portion, the ratio of said active signal portion to the sum of said active and inactive signal portions corresponding to the power attenuation to be applied to the load;
    means, responsive to said pulse width modulated signal for providing a plurality of activation pulses during the active signal portion of said pulse width modulated signal, and a plurality of deactivation pulses during said inactive signal portion of said pulse width modulated signal;
    isolation means, coupled to said means for providing a plurality of activation and deactivation pulses, and having an input section and an output section, said input section including first and second segments for receiving said activation and deactivation pulses at a first voltage potential, said output section including first and second segments and adapted for providing said activation and deactivation pulses at a second voltage potential independent of said first voltage potential;
    power switching means, responsive to said output section of said transformer means, for connecting power to the load during receipt of said activation pulses, and for disconnecting the power from said load during receipt of said deactivation pulses, said power switching means including;
    bidirectional series power switch means having a first switch element responsive to power of a first polarity, and a second switch element responsive to power of a second, opposite polarity, for providing bidirectional current flow through the power switch means; and
    bidirectional shunt switch means, having a first switch element responsive to a load current of a first polarity, and a second switch element responsive to a load current of a second, opposite polarity for providing bidirectional load current flow through the shunt switch means.

2. An AC and DC power attenuator, for attenuating both AC and DC input power to a load as a function of an input control signal which represents a selected percentage of power to be applied to the load comprising:
    pulse width modulation means, responsive to the input control signal, for providing a pulse width modulated signal having an active signal portion and an inactive signal portion, the ratio of said active signal portion to the sum of said active and inactive signal portions corresponding to the percentage of power to be applied to the load;
    means, responsive to said pulse width modulated signal, for providing a plurality of activation pulses during the active portion of said pulse width modulated signal, and a plurality of deactivation pulses during the inactive portion of said pulse width modulated signal;
    isolation means, responsive to said means for providing activation and deactivation pulses, and having an input section and an output section, for receiving said activation and deactivation pulses at a first voltage potential and for providing said activation and deactivation pulses at a second voltage potential; and
    power switching means, coupled to said isolation means, and including bidirectional series power switch means having at least a first switch element responsive to power of a first polarity and at least a second switch element responsive to power of a second, opposite polarity, for providing bidirectional current flow through the power switch means and for connecting power to the load during receipt of said activation pulses, and for disconnecting the power from the load during receipt of said deactivation pulses.

3. The power attenuator of claim 2 in which said input control signal further includes a power attenuator device address code.

4. The power attenuator of claim 2 further including an output port for outputting a power attenuator status signal.

5. The power attenuator of claim 2 in which said bidirectional series power switch means further includes gate drive means, coupled to said first and second switch elements, and responsive to said activation and deactivation pulses, for selectively activating and deactivating said bidirectional series power switch in response to said activation and deactivation pulses.

6. The power attenuator of claim 5 in which said input section of said isolation means includes first and second segments, for receiving at a first voltage potential said activation and deactivation pulses respectively, and
    said output section of said isolation means includes first and second segments, adapted for coupling said activation and deactivation pulses from said first and second input segments to said bidirectional series power switch means at a second voltage potential independent of said first voltage potential.

7. The power attenuator of claim 6 in which said gate drive means comprises:

a first gate drive device, coupled to said bidirectional series power switch, and energized in response to said activation pulses from the first segment of the output section of said isolation means, for enabling said bidirectional series power switch to provide power to the load;

a second gate drive device, coupled to said bidirectional series power switch, and energized in response to said deactivation pulses from said second segment of said output stage of said voltage translation means, for disabling said bidirectional series power switch and interrupting power to the load;

a third gate drive device, coupled to said first gate drive device, and energized in response to said deactivation pulses from the second segment of said output section of said isolation means, for disabling said first gate drive device during the period of time that said second gate drive device is energized; and a fourth gate drive device, coupled to said second gate drive device, and energized in response to said activation pulses from the first segment of the output stage of said isolation means, for disabling said second gate drive device during the period of time that said first gate drive device is energized.

8. The power attenuator of claim 7, in which said gate drive devices include field effect transistors.

9. The power attenuator of claim 5 in which said power switching means further includes means for supplying DC power to said gate drive means.

10. The power attenuator of claim 6 further including bidirectional power switch shunt means in parallel with the load, and responsive to said first and second segments of the output section of said isolation means, and energized in response to the receipt of said deactivation pulses during deactivation of said bidirectional series power switch, for providing a path within which load current may recirculate.

11. The power attenuator of claim 10 in which said bidirectional power switch shunt means includes at least a first switch element responsive to load current of a first polarity, and a least a second switch element responsive to load current of a second, opposite polarity for providing bidirectional current flow through the power switch shunt means.

12. The power attenuator of claim 11 in which said bidirectional power switch shunt means further includes shunt switch drive means, coupled to the said first and second power switch shunt element, and responsive to the output section of said isolation means, for selectively energizing and de-energizing said bidirectional power switch shunt means.

13. The power attenuator of claim 12 in which said shunt switch drive means comprises:

a first shunt drive device coupled to said bidirectional power switch shunt means, and energized in response to said deactivation pulses from the second segment of the output section of said isolation means, for enabling said bidirectional power switch shunt means for providing a path for the load current to recirculate;

a second shunt drive device, coupled to said bidirectional power switch shunt means, and energized in response to said activation pulses from the first segment of the output section of said isolation means, for disabling said power switch shunt means;

a third shunt drive device, coupled to said first shunt drive device, and energized in response to said activation pulses from the first segment of said output section of the isolation means, for disabling said first shunt drive device; and a fourth shunt drive device, coupled to said second shunt drive device, and energized in response to said deactivation pulses from the second segment of said output section of said isolation means, for disabling said second shunt drive device.

14. The power attenuator of claim 13 in which said shunt drive devices include FETs.

15. The power attenuator of claim 2 further including primary driver means, coupled to the input stage of said isolation means, and energized in response to said means for providing activation and deactivation pulses, for providing said activation and deactivation pulses to the input section of said isolation means.

16. The power attenuator of claim 15 in which primary driver means includes first and second primary driver devices, said first primary driver device adapted for providing said activation pulses to the first segment of the input section of said isolation means, and said second primary driver device adapted for providing said deactivation pulses to the second segment of the input section of said isolation means.

17. The power attenuator of claim 16 in which said first and second primary driver devices include first and second FETs.

18. The power attenuator of claim, 2 in which said input control signal includes a digital signal.

19. The power attenuator of claim 2 in which said input control signal includes an analog signal.

20. The power attenuator of claim 2 in which said pulse width modulation means includes counter means.

21. The power attenuator of claim 2 further including means, coupled to said pulse width modulation means, for selecting a percentage of power to be applied to the load as a function said input control signal.

22. The power attenuator of claim 21 in which said means for selecting a percentage of power to be applied to the load includes microprocessor means.

23. The power attenuator of claim 22 in which said microprocessor means is coupled to said pulse width modulation means, for providing a digital power attenuation signal in response to said input control signal.

24. The power attenuator of claim 23 in which said microprocessor means includes means for storing a predetermined address code, and for generating said digital power attenuation signal upon the condition that said power attenuator device address code corresponds to said predetermined address code.

25. The power attenuator of claim 2 in which said isolation means includes at least one transformer.

26. The power attenuator of claim 2 further including filter means, responsive to said bidirectional series switch means and said bidirectional shunt switch means, for integrating the output of said switches into a smooth power output waveform.

27. The power attenuator of claim 2 further including means for sensing a value corresponding to a change in a condition in the load.

28. The power attenuator of claim 27 in which said condition includes a change in voltage, current or temperature.

29. The power attenuator of claim 27 in which the means for sensing further includes means for modifying said pulse width modulated signal for controlling said change in condition as a function of said sensed value.

30. The power attenuator of claim 2 further including means for storing within the attenuator, a power attenuation signal which selects a percentage of power to be applied to the load.

31. The power attenuator of claim 30 in which said means for storing within the attenuator includes a semiconductor storage device.

32. The power attenuator of claim 31 in which said semiconductor storage device includes a ROM or a RAM.

33. The power attenuator of claim 2 further including an input port, for receiving said input control signal from a remote power attenuation selection device.

34. The power attenuator of claim 33 in which said remote power attenuation selection device includes a computer.

35. The power attenuator of claim 33 in which said remote power attenuation selection device includes a light intensity control instrument.

36. The power attenuator of claim 33 further including second isolation means, coupled to said input port for receiving said input control signal.

37. The power attenuator of claim 36 in which said isolation means includes an optical coupler.

38. The power attenuator of claim 26 wherein said output waveform is a scaled replica of an input waveform.

39. A transformer coupled, full scale, AC or DC power attenuator, for attenuating power to a load as a function of a control signal which represents a selected percentage of power to be applied to the load comprising:

means for receiving a control signal and for providing first and second control output signals representing the selected percentage of power to be applied to the load;

means, coupled to said means for receiving a control signal, for providing a plurality of high speed activation pulses in response to said first control output signal, and a plurality of high speed deactivation pulses in response to said second control output signal, for providing non-saturating transformer drive signals;

transformer means responsive to said high speed activation and deactivation pulses, and having an input section and an output section, for receiving said high speed activation and deactivation pulses and for providing on said output section a replica of said high speed activation and deactivation pulses; and power switching means, responsive to said high speed activation and deactivation pulses, for connecting power to the load during receipt of said activation pulses, and for disconnecting the power from the load during receipt of said deactivation pulses.

* * * * *